(12) United States Patent
    Capitan

(10) Patent No.: US 12,453,064 B2
(45) Date of Patent: Oct. 21, 2025

(54) ELECTRONIC APPARATUS

(71) Applicant: ATEME, Velizy Villacoublay (FR)

(72) Inventor: Jean-Michel Capitan, Vauhallan (FR)

(73) Assignee: ATEME, Velizy Villacoublay (FR)

( * ) Notice: Subject to any disclaimer, the term of this patent is extended or adjusted under 35 U.S.C. 154(b) by 407 days.

(21) Appl. No.: 18/080,361

(22) Filed: Dec. 13, 2022

(65) Prior Publication Data

US 2023/0189489 A1    Jun. 15, 2023

(30) Foreign Application Priority Data

Dec. 13, 2021  (FR) ...................................... 2113405

(51) Int. Cl.
| | |
|---|---|
| *H05K 9/00* | (2006.01) |
| *H03H 1/00* | (2006.01) |
| *H03H 7/01* | (2006.01) |
| *H03H 7/06* | (2006.01) |
| *H05K 1/18* | (2006.01) |

(52) U.S. Cl.
CPC ......... *H05K 9/0022* (2013.01); *H03H 7/0115* (2013.01); *H03H 7/06* (2013.01); *H05K 1/18* (2013.01); *H05K 9/006* (2013.01); *H03H 1/0007* (2013.01)

(58) Field of Classification Search
CPC .. H01L 23/552; H05K 9/0022; H05K 1/0218; H03H 1/0007; H03H 7/0115
USPC ......................................... 333/175, 181, 185
See application file for complete search history.

(56) References Cited

U.S. PATENT DOCUMENTS

2015/0229288 A1* 8/2015 Kisner ................. H03H 7/0115
                                                    333/168
2020/0396871 A1    12/2020 Yun et al.

FOREIGN PATENT DOCUMENTS

WO    2009/129447 A2    10/2009

OTHER PUBLICATIONS

Kester et al., "Section 9. Hardware Design Techniques," in Practical Analog Design Techniques, Analog Devices, 1995, 92 pages.
Search Report issued in related application FR 2113405, Aug. 17, 2022, 2 pages.

* cited by examiner

*Primary Examiner* — Rakesh B Patel
(74) *Attorney, Agent, or Firm* — Faegre Drinker Biddle & Reath LLP

(57) ABSTRACT

An electronic apparatus comprising an electronic board on which are placed an electronic subassembly and a filtering unit, the analog subassembly comprising one or more radiofrequency analog components for receiving radiofrequency components is proposed. The analog subassembly is protected by shielding placed on one side of the electronic board, the filtering unit is placed on the side of the electronic board on a signal path electrically connected to the analog subassembly, the filtering unit comprises a capacitive component placed under the shielding and connected to an analog ground, and the filtering unit further comprises a filtering component placed on the input to the filtering unit in series with the signal path on passing through the shielding or in the immediate vicinity of the shielding.

19 Claims, 4 Drawing Sheets

ELECTRONIC APPARATUS

CROSS-REFERENCE TO RELATED APPLICATIONS

This application claims priority benefit under 35 U.S.C. § 119(d) from French Patent Application No. 2113405, filed Dec. 13, 2021, the disclosure of which is incorporated by reference herein in its entirety.

FIELD

The present disclosure relates to an electronic apparatus. In particular, it applies to electronic apparatuses for radiofrequency analog signal acquisition.

BACKGROUND

Electronic apparatuses for radiofrequency analog signal acquisition typically comprise analog components forming an analog block for radiofrequency analog signal reception, components of a power supply block for the analog block, and also in some cases digital components providing various functions, such as for example a control signal generation function for the analog block. The analog block is further typically protected from external electromagnetic interference by an electromagnetic protection cover, in particular in order to preserve the performance of the analog components of the analog block which could otherwise be degraded by noise generated by the digital components or the components of the power supply block. The filtering unit may further be used to implement filtering between the analog block and the digital components electrically coupled to the analog block and/or between the analog block and the power supply components which are electrically coupled to the analog block.

The effectiveness of the filtering done by the filtering unit may then greatly decrease depending on the placement of the filtering unit on the filtered signal path.

SUMMARY

An object of the present subject disclosure is to at least partially remedy the aforementioned disadvantages.

According to a first aspect, an electronic apparatus is proposed which comprises an electronic board on which are placed an electronic subassembly and a filtering unit, the analog subassembly comprising one or more analog components, wherein the analog subassembly is protected by shielding placed on one side of the electronic board, wherein the filtering unit is placed on the side of the electronic board on a signal path electrically connected to the analog subassembly (for example electrically connecting one or more components located outside the shielding of the analog subassembly), wherein the filtering unit comprises a capacitive component placed under the shielding and connected to an analog ground, and wherein the filtering unit further comprises a filtering component placed on the input to the filtering unit in series with the signal path on passing through the shielding or in the immediate vicinity of the shielding.

Because of the placement of the capacitive component of the filtering unit under the shielding and the placement of the filtering component of the filtering unit placed in input to the filtering unit in series on the signal path on passing through the shielding or immediately next to (meaning in immediate proximity or the closest possible) the outside of the shielding the proposed apparatus can advantageously improve the effectiveness of the filtering of electromagnetic interference generated by components outside the shielding, whether it involves components on the electronic board (for example the components of a disrupting block or components external to the electronic board (for example electromagnetic interference generated by a power supply of the computer server or PC into which the electronic board is inserted (for example in an expansion slot)) which would otherwise disturb operation of the analog subassembly by coupling to the signal entering under the shielding.

In one or more embodiments, the filtering unit of the proposed apparatus comprises a filtering component placed in input to the filtering unit in series on the signal path electrically connecting components (for example electronic) located outside the shielding (for example a signal coming from an electromagnetic interference generating block outside the shielding protecting the analog subassembly) to the analog subassembly, which is advantageously placed on passing through the shielding or, according to the selected embodiment, immediately next to the shielding (spaced as little as possible from the shielding, for example from the shielding cover), so as to effectively filter any electromagnetic interference outside the analog subassembly protected by the shielding (for example placed under a shielding cover). This placement of the input filtering component of the filtering unit closest to the shielding or, when that is impossible, on passing through the shielding (and therefore the cover when the shielding comprises a cover), advantageously serves to limit, or even avoid, exposure of the filtered signal on output from this filtering component to electromagnetic noise which could disrupt operation the components protected by the shielding. In fact, in the embodiments in which the filtering component is placed closest to the shielding, the length of the signal path portion on output from this component located outside of the shielding (signal path portion between the output of the filtering component and the shielding) is reduced as much as possible in order to avoid that this path portion might pick up surrounding electromagnetic noise which would then be injected with the signal entering into the shielding, or limit as much as possible the quantity of noise picked up. In the embodiments in which the filtering component is placed on passing through the shielding, the signal output from this component is not polluted by the surrounding noise because it is protected by the shielding.

The filtering unit of the proposed apparatus further comprises a capacitive component connected to an analog ground, located downstream from the filtering component on the signal path, which therefore receives on input a filtered signal coming from the filtering component placed in series. This capacitive component is placed under the shielding, and in that way placed inside the shielding (for example under a shielding cover protecting the analog subassembly), in order to be able to place the filtering component, located upstream, passing through the shielding or immediately next to the shielding.

This capacitive component of the filtering unit behaves as a wire for the high-frequency signals which will pass through it, in particular for the high-frequency noise signals, and may therefore be used for directing high-frequency interference present in the output signal from the filtering component to ground. If this capacitive component of the filtering unit were placed outside the shielding protecting the analog subassembly, the filtering component(s) would filter the noise from the signal passing through it, but this noise would be coupled to the capacitive component of the filtering unit by electrical noise from ground, such that the noise filtered by the filtering component(s) would nevertheless be found from the opposite side of the digital ground of the filtering component(s) (this noise would mirror the digital ground noise present outside the shielding), and would penetrate the analog subassembly protected by the shielding. The filtering unit would therefore be less effective, and this disadvantage can be advantageously avoided by the proposed placement of the capacitive component of the filtering unit under the shielding.

The effectiveness of the filtering unit such as configured in the proposed apparatus is thus preserved, both by the placement of the filtering component on the input closest to the filtering unit (placed in series) or, according to the embodiment, on passing through the shielding (for example the shielding cover), and also by the placement of the output capacitive component of the filtering unit under the shielding. Thus, according to the selected embodiment, the proposed apparatus can advantageously preserve (and therefore improve compared to existing configurations) the effectiveness of the filtering done by the filtering unit between the analog subassembly and the digital subassembly, or between the analog subassembly and the power supply subassembly.

According to a second aspect, an electronic apparatus is proposed comprising an electronic board on which are placed an electronic subassembly and a filtering unit, the analog subassembly comprising one or more analog components, wherein the analog subassembly is protected by shielding placed on one side of the electronic board, wherein the filtering unit is placed on the side of the electronic board on a signal path electrically connecting one or more components outside the shielding of the analog subassembly, wherein the filtering unit comprises a capacitive component placed under the shielding and connected to an analog ground, and wherein the filtering unit further comprises a filtering component placed on the input to the filtering unit in series with the signal path on passing through the shielding or in the immediate vicinity of the shielding.

According to another aspect, an electronic apparatus comprising an electronic board is proposed on which are placed, on the side of the electronic board, an analog subassembly, a power supply/digital block, and a filtering unit, the analog subassembly comprising one or more analog components, the power supply/digital block comprising a digital subassembly and/or a power supply subassembly, the digital subassembly comprising one or more digital components and the power supply subassembly comprising one or more electric power supply components of the analog subassembly, wherein the analog subassembly is protected by a shielding placed on the side of the electronic board, wherein the filtering unit is placed on a signal path between the analog subassembly and the power supply/digital block, wherein the filtering unit comprises a capacitive component located under the shielding, and wherein the filtering unit comprises a filtering component placed in series on the signal path on passing through the shielding or immediately by the shielding.

Because of the placement of the capacitive component of the filtering unit under the shielding and the placement of the filtering component of the filtering unit placed in input to the filtering unit in series on the signal path on passing through the shielding or immediately next to (meaning in immediate proximity or the closest possible) the outside of the shielding the proposed apparatus in this aspect can advantageously improve the effectiveness of the filtering between both the analog subassembly comprising one or more analog components and protected from external electromagnetic interference by shielding (comprising for example a shielding cover protecting the component(s) of the analog subassembly) and also power supply/digital block, and that the placement of these components such as proposed serves to avoid a reduction of the filtering effectiveness of the filtering unit.

According to another aspect, electronic apparatus comprising an electronic board is proposed on which are placed and analog subassembly, power supply/digital block, and a filtering unit, the analog subassembly comprising one or more radiofrequency analog components for low-power radiofrequency receiving, the power supply/digital block comprising a digital subassembly and/or a power supply subassembly, the digital subassembly comprising one or more digital components and the power supply subassembly comprising one or more electric power supply components of the power supply subassembly, wherein the analog subassembly is protected by a shielding cover, wherein the filtering unit is placed on a signal path between the analog subassembly and the power supply/digital block, and wherein the filtering unit is placed on the signal path on passing through the shielding cover or immediately by the shielding cover.

The characteristics disclosed in the following paragraphs may, optionally, be implemented. They may be implemented independently of each other or in combination with each other:

In one or more embodiments, the analog subassembly comprises one or more analog components for receiving radiofrequency signals.

In one or more embodiments, the apparatus further comprises a power supply/digital block placed on the electronic board, where the power supply/digital block comprises a digital subassembly and/or a power supply subassembly, where the digital subassembly comprises one or more digital components, and the power supply subassembly comprises one or more electric power supply components for the analog subassembly, and the filtering unit is placed between the analog subassembly and the power supply/digital block.

In one or more embodiments, the signal path is between the analog subassembly and the digital subassembly, which advantageously allows using the filtering unit in the configuration proposed for filtering signals between the analog subassembly and the digital subassembly. For example, in one or more embodiments, the filtering unit is configured for filtering a control signal coming from the digital subassembly in order to control the analog subassembly, for example for configuring it (for example an I2C format control signal).

In one or more embodiments, the signal path is between the analog subassembly and the power supply subassembly, which advantageously allows using the filtering unit in the configuration proposed for filtering signals between the analog subassembly and the power supply subassembly. For example, in one or more embodiments, the filtering unit is configured for filtering a power supply signal coming from a power supply subassembly in order to electrically supply the analog subassembly.

In one or more embodiments, the filtering unit comprises an LC or RC type filtering cell.

In one or more embodiments, the shielding comprises a shielding cover, and the filtering component placed in series on the signal path is placed passing through the shielding cover or immediately by the shielding cover.

In one or more embodiments, the shielding comprises a shielding cover, and the filtering component placed in series is an inductive component placed astride in series under the shielding cover between the power supply/digital block and the analog subassembly.

In other embodiments, the shielding comprises a shielding cover, and the filtering component placed in series is the resistive component placed astride in series under the shielding cover between the power supply/digital block and the analog subassembly.

BRIEF DESCRIPTION OF THE DRAWINGS

Other specifics and advantages of the present subject disclosure appear in the following description of nonlimiting examples of implementation with reference to the attached drawings in which.

DETAILED DESCRIPTION

Figure 1A:
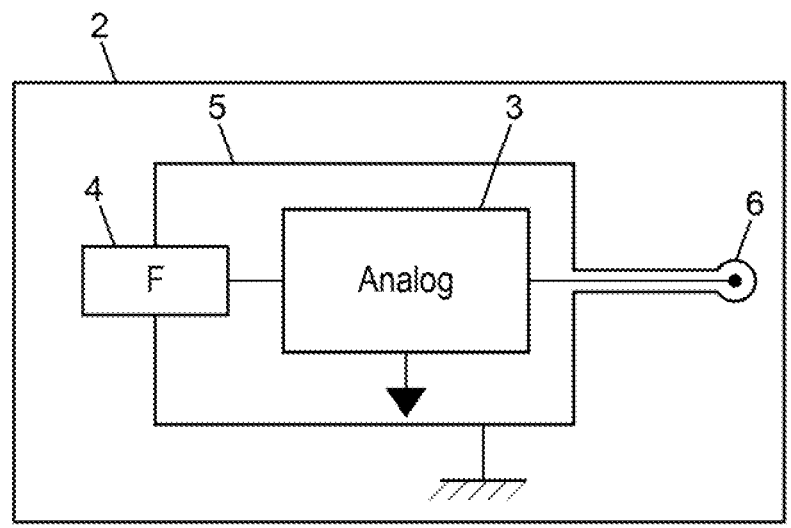
FIG. 1a is a drawing showing an electronic apparatus example according to one or more embodiments.

In the following detailed description of embodiments of the present subject disclosure, many specific details are presented for providing a more complete understanding. Nevertheless, the person skilled in the art may observe that embodiments may be practiced without these specific details. In other cases, well-known characteristics are not described in detail in order to avoid unnecessarily complicating the present description.

The present application refers to functions, motors, units, modules, platforms and illustrations of diagrams of the methods and apparatuses according to one or more embodiments. Unless otherwise relevant in the present, each of the functions, motors, modules, platforms, units and diagrams described may be implemented in material, software (including in "firmware" or "middleware" form), microcode or any combination thereof. In the case of an implementation in software form, the functions, motors, units, modules and/or illustrations of diagrams may be implemented by computer program instructions or software code, which may be stored or transmitted on a computer readable medium, including a non-volatile medium, or a medium loaded into memory of a generic, specific or other type of computer or programmable data processing apparatus for producing a machine, such that the computer program instructions or the software code executed on the computer or equipment or programmable apparatus for data processing constitute means for implementing these functions.

Further, the terms "in particular," "for example," "example," and "typically" are used in the present description in order to designate examples or illustrations of nonlimiting embodiments, which do not necessarily correspond to preferred or advantageous embodiments compared to other possible aspects or embodiments.

The expressions "analog subassembly" and "analog part" are used without distinction in the present description for designating subassemblies of one or more electronic components (which are called "analog") configured for processing analog signals. The expressions "radiofrequency subassembly," "analog/radiofrequency subassembly," and "radiofrequency part" are used without distinction in the present description for designating subassemblies of one or more electronic components (which are called "analog radiofrequency" or "radiofrequency") configured for processing radiofrequency analog signals. The expressions "digital subassembly" and "digital part" are used without distinction in the present description for designating subassemblies comprising one or more electronic components (which are called "digital") configured for processing digital signals and/or electric power supply components. The expressions "power supply subassembly" and "power supply part" are used without distinction in the present description for designating electric power supply subassemblies comprising one or more electronic components (which are then called "electric power supply" or "power supply").

The terms "operationally coupled," "coupled," "connected" and various variants and forms thereof used in the present refer to physical, electrical, electronic or mechanical couplings and connections, which may be direct or indirect and comprise in particular connections between electronic components (for example in copper trace form, for example on a printed circuit), between electronic equipment or between portions of such equipment which allow operations and functions such as described in the present application.

FIG. 1a shows an electronic apparatus example according to one or more embodiments.

The apparatus 1 from FIG. 1a comprises an electronic board 2 on which are located an analog subassembly 3, a filtering unit 4 and an input interface 6.

The analog subassembly 3 is protected from external electromagnetic interference by shielding, comprising for example a shielding cover 5. The shielding cover serves to effectively protect the electronic signals passing under the shielding cover so they are not disturbed by noise, and in particular high-frequency noise which is present outside the shielding cover 5. In one or more embodiments, the shielding protecting the analog subassembly from environmental electromagnetic noise comprises a shielding cover 5 and one or more layers (not shown in the figure) of copper ground (preferably analog) formed in the copper of the printed circuit of the electronic board 2 by closing shielding in the electronic board and opposite the shielding cover 5.

The noise (electromagnetic) which could affect the operation or performance of the components of the analog subassembly 3 may be generated by one or more components in the electronic environment of the electronic apparatus 1 disrupted by noise because unprotected by the surrounding shielding cover 5, which forms an "outside world" to the analog subassembly 3 that is to be protected. Depending on the embodiments, these components may comprise power supply and/or digital subassembly components placed on the electronic board 2 (not shown on the figure) and/or a power supply and/or digital subassembly component (not shown in the figure) outside the electronic apparatus 1, such as for example the components of an electric power supply of the server type platform within which the electronic apparatus 1 is inserted.

In one or more embodiments, the analog subassembly 3 comprises one or more analog signal processing components, for example for very low amplitude.

In particular, the proposed apparatus can be advantageously applied for an analog subassembly 3 of the type comprising one or more very low-level analog signal processing components. Because of the sensitivity of this type of analog subassembly at noise levels which are comparable, or even lower than the signal level processed by components of the analog subassembly 3 (which are for example on the order of a few μV), the operation of the analog subassembly at the expected performance can only be obtained by protecting this analog subassembly from external noise (including external electromagnetic interference) by shielding, comprising for example shielding cover 5 placed on the side of the electronic board 2. The use of shielding is even more relevant in the scenario in which the noise level is greater than that of the signals processed by the analog subassembly 3 (noise level which is for example on the order of several tens or hundreds of μV, or greater than that of the analog signals processed by the analog subassembly).

In one or more embodiments, the analog subassembly 3 comprises one or more radiofrequency analog signal processing components, for example for high-frequency (HF) radiofrequency signals.

In particular, the proposed apparatus can be advantageously applied to an analog subassembly 3 of the type comprising one or more analog components for radiofrequency reception, for example at low level. Because of the sensitivity of this type of analog subassembly at noise levels which are comparable, or even lower than the signal level processed by components of the analog subassembly 3 (which are for example, per satellite receiving signals, on the order of a few dBμV), the operation of the analog subassembly at the expected performance can only be obtained by protecting this analog subassembly from external noise (including external electromagnetic interference) by shielding, comprising for example a shielding cover 5 placed on the side of the electronic board 2. The use of shielding is even more relevant in the scenario in which the noise level is greater than that of the signals processed by the analog subassembly 3 (noise level which is for example on the order of several tens or hundreds of dBμV, or much greater than that of the satellite receiving signals).

Figure 1B:
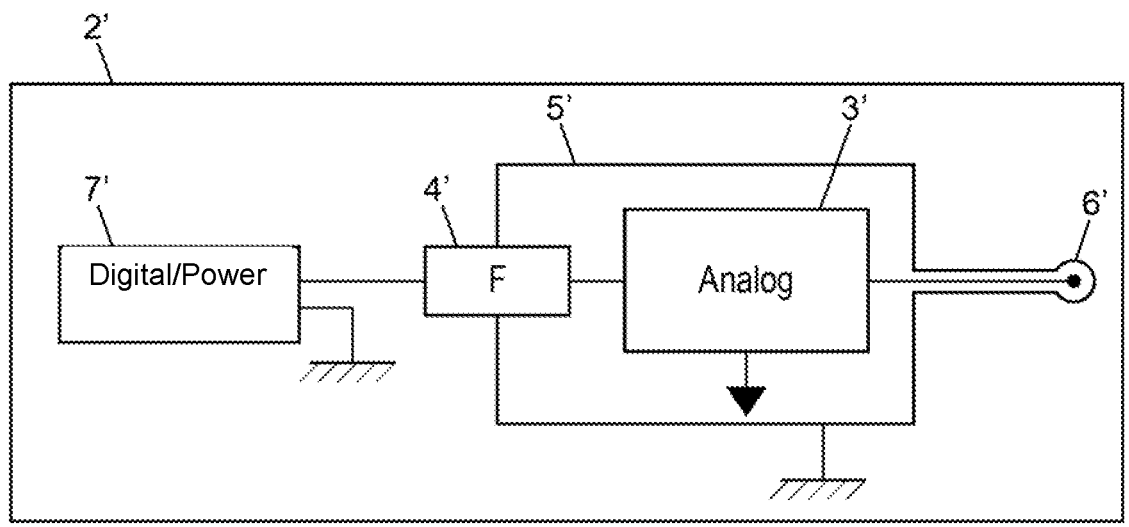
FIG. 1b is a drawing showing an electronic apparatus example according to one or more embodiments.

The filtering unit 4 for the apparatus 1 is placed on a signal path electrically connected to the analog subassembly 3. For example, in one or more embodiments, the filtering unit 4 of the apparatus 1 is placed on a signal path electrically connecting one or more components (for example electrical or electronic) located outside of the shielding (for example placed on the electronic board 2, as shown by FIG. 1b) to the analog subassembly 3. Additionally, the filtering unit 4 comprises a capacitive component placed under the cover 5 and connected to an analog ground protected by the shielding 5, and a filtering component placed in series and placed in input to the filtering unit 4 on the signaling path passing through the shielding cover 5 or, according to a selected embodiment, immediately next to the shielding cover 5, so as to advantageously increase the filtering effectiveness of the signals coming from the "outside world" to the analog subassembly 3 (signals coming from the electronic environment of the electronic apparatus 1 disrupted by noise because unprotected by the shielding cover 5) routed towards the analog subassembly 3 inside the cover 5 in order to protect the operation of the analog subassembly from electromagnetic interference carried by these signals. In the one or more embodiments, the filtering unit 4 may thus comprise, on input, a filtering component placed in series on the signal path on passing through the shielding or immediately by the shielding, and on output a capacitive component placed under the shielding.

Advantageously, the filtering component and the capacitive component of the filtering unit 4 are placed on the same side of the electronic board as that on which the shielding cover 5 and the analog subassembly 3 are placed, such that the filtering unit 4 is placed, at least in part, on the same side of the electronic board as that on which the shielding cover 5 is placed, on a signal path connected to the analog subassembly 3 protected by the shielding 5.

In one or more embodiments, the electronic apparatus 1 comprises an electronic board 2 on which a printed circuit is implemented for the placement and routing of electronic components on the electronic board 2. In one or more embodiments, the filtering component placed in series and the capacitive component of the filtering unit 4 are placed on the same side of the electronic board as that on which the components of the analog subassembly 3 and the shielding cover 5 are placed. In one or more embodiments, the filtering unit 4 is placed on the same side of the electronic board as that on which the components of the analog subassembly 3 and the shielding cover 5 are placed.

The component of the filtering unit 4 receiving the input signal from the filtering unit 4 (which may be, according to the embodiments, an inductive or resistive component) is placed, according to the embodiments, passing through the cover 5 or immediately next to the cover 5 on the outside thereof. In that way, the input signal (to be filtered) of the filtering unit 4 does not enter under the shielding cover 5 so as to not disturb the operation or the performance of the components of the analog subassembly 3.

The other way around, the capacitive component of the filtering unit 4 is placed under the shielding cover 5 so as to connect with the noise-free electronic environment of the analog subassembly 3 that is protected by the shielding cover 5.

Thus, the input component of the filtering unit 4, placed in series on passing through the cover 5 or immediately next to the cover 5, makes the connection with the electronic environment of the electronic apparatus 1 disrupted by noise (because unprotected by the shielding cover 5), whereas the (capacitive) output component of the filtering unit 4 placed under the shielding cover 5 connects with the noise-free electric environment of the analog subassembly 3 that is protected by the shielding cover 5.

If the output capacitive component of the filtering unit 4 were placed outside of the shielding cover 5, the whole of the filtering unit 4 would be placed outside of the shielding cover 5 such that the filtered signal (without disruption by noise) on output from the filtering unit 4 could again be subject to noise before entering under the shielding cover 5. The effectiveness of the filtering unit 4 would therefore find itself potentially greatly reduced. In fact, the capacitive component of the filtering unit 4, if it were placed outside of the shielding cover 5, could itself pick up surrounding electromagnetic noise which would be added to the signal on output from the filtering unit 4 and directed towards the analog subassembly 3. Further, if the output capacitive component from the filtering unit 4 were placed outside the shielding cover 5, it would be impossible to place the input filtering component of the filtering unit 4 placed in series (on the signal path) on passing through or immediately next to the shielding cover 5.

In one or more embodiments, the capacitive component of the filtering unit 4 (placed under the shielding cover 5) serves to create a signal path that is very low impedance at high frequency intended for improving the passage of the high-frequency component of the signals to be filtered.

In one or more embodiments, the capacitive component of the filtering unit 4 may be connected to a ground so as to direct the high-frequency signals towards this ground, which serves to filter the high-frequency component from the signals to be filtered.

In one or more embodiments, the printed circuit of the electronic board 2 may be configured with a ground plane comprising an analog ground and a digital ground (sometimes also called mechanical ground) that are distinct from each other. On the figures, a digital ground is represented by a rake symbol, whereas an analog ground is represented by an arrow pointing downward. Digital grounds are grounds intended to receive signals disrupted by noise (for example from digital switching noise), whereas analog grounds are, in contrast to digital grounds, intended to be isolated from these signals disrupted by noise. In the example from FIG. 1a, the analog part, comprising the input interface 6 and the analog subassembly 3, uses an analog ground.

In one or more embodiments, the ground to which the capacitive component of the filtering unit 4 (placed under the shielding cover 5) is connected is preferably an analog ground, so as to avoid that noise coming from a digital ground (connected to the capacitive component) through the capacitive component comes to disturb the operation or the performance of the analog subassembly. In one or more embodiments, the ground present within the shielding 5 zone in which the capacitive component of the filtering unit 4 is placed is also of the analog type in order to protect the components of this zone from ground noise.

In one or more embodiments, the filtering unit 4 thus implements a filtering structure for the signals on input by a filtering component (for example an inductance and/or a resistance) placed passing through the shielding or immediately next to the shielding (for example placed on the outside, but as close as possible, even adhered to the shielding), and the high-frequency signals having passed through the filtering component (which constitute high-frequency interference isolated by the filtering component on input to the filtering unit 4) and entering under the shielding cover 5 are going to be directed towards the ground by a capacitive component of the filtering unit 4 placed under the shielding cover 5 and connected to an analog ground.

The filtering type or parameters for the filtering unit 4 and in particular the bandwidth may be selected as a function of the desired filtering.

For example, depending on the implementation, the filtering unit 4 may comprise an inductive component L and be configured for implementing an LC type filtering cell or comprise a resistive component R and be configured for implementing an RC type filtering cell.

FIG. 1a shows an example input interface 6 for apparatus 1 configured for receiving a radiofrequency input signal, for example an HF signal, and to be coupled to the analog subassembly 3 for processing the signal received on the input interface 6 by the analog subassembly 3. For example, in one or more embodiments, the input interface 6 is powered by a low noise power supply block (not shown on the figure) and is arranged for receiving an input modulated video broadcast signal in an input frequency band.

As shown by FIG. 1a, in one or more embodiments, the input interface 6 may be protected by the shielding, and for example be coaxial, in order for example to advantageously be able to connect a coaxial cable for receiving radiofrequency signals, such as for example a cable for receiving video signals broadcast by satellite, to the apparatus 1, by extending shielding to 360° (over the entire surrounding of the cable) in order to protect the input interface 6 with the shielding.

FIG. 1a shows therefore a filtering unit 4 comprising filtering component (placed in input to the filtering unit, in series on a signal path connected to the analog subassembly 3) and the capacitive component placed under the shielding, one component of which is, in whole or in part, placed outside of the shielding (filtering component), and at least one other component is placed inside the shielding (capacitive component). According to the embodiment, the filtering component is positioned passing through the cover 5 protecting the analog subassembly 3 from electromagnetic interference or, according to the embodiment, positioned immediately by the exterior of the shielding 5. In one or more embodiments, the filtering component placed in series is placed passing through the shielding (for example passing through the shielding cover of the shielding protecting the analog subassembly 3), in which case the filtering component is in part outside the shielding and in part inside the shielding, such that the signal output from this component is then protected by the shielding. In other embodiments, this filtering component placed in series is placed outside of the shielding and immediately next to the shielding (for example passing through the shielding cover of the shielding protecting the analog subassembly 3), in which case the filtering component is placed outside of the shielding but immediately next to this shielding such that the length of the signal path between the output of this component and the shielding 5 is as short as possible (given the constraints on placement of electronic elements on the board 2), in order to minimize as much as possible the path length on output from the filtering component placed in series which is not protected by the shielding.

FIG. 1b shows an electronic apparatus example according to one or more embodiments, in which a power supply/digital block generating electromagnetic interference is placed on the electronic board of the apparatus.

The apparatus 1 from FIG. 1b comprises an electronic board 2 on which are located an analog subassembly 3', a power supply/digital block 7', a filtering unit 4 and an input interface 6'.

The analog subassembly 3' is protected from external electromagnetic interference by shielding, comprising for example a shielding cover 5'. The shielding cover 5' serves to effectively protect the electronic signals passing under the shielding cover 5' in order to allow them not to be disturbed by noise, and in particular high-frequency noise which is present outside the shielding cover 5'. In one or more embodiments, the shielding protecting the analog subassembly from environmental electromagnetic noise comprises a shielding cover 5' and one or more layers (not shown in the figure) of copper ground (preferably analog) formed in the copper of the printed circuit of the electronic board 2' by closing shielding in the electronic board and opposite the shielding cover 5'.

The (electromagnetic) noise which could affect the operation or the performance of the components of the analog subassembly 3' may be generated by one or more components in the electronic environment of the electronic apparatus 1 disrupted by noise because unprotected by the surrounding shielding cover 5, which forms an "outside world" to the analog subassembly 3 that is to be protected, and in particular by one or more components of the power supply/digital block 7', and/or by one or more components of power supply and/or digital subassemblies (not shown on the figure external to the electronic apparatus 1', such as for example the components of an electric power supply for a server type platform within which the electronic apparatus 1' is inserted.

In one or more embodiments, the analog subassembly 3' comprises one or more analog signal processing components, for example for very low amplitude signals.

In particular, the proposed apparatus can be advantageously applied for an analog subassembly 3' of the type comprising one or more very low-level analog signal processing components. Because of the sensitivity of this type of analog subassembly at noise levels which are comparable, or even lower than the signal level processed by components of the analog subassembly 3' (which is for example on the order of a few μV), the operation of the analog subassembly at the expected performance can only be obtained by protecting this analog subassembly from external noise (including external electromagnetic interference) by shielding, comprising for example shielding cover 5' placed on the side of the electronic board 2'. The use of shielding is even more relevant in the scenario in which the noise level is greater than that of the signals processed by the analog subassembly 3' (noise level which is for example on the order of several tens or hundreds of μV, or greater than that of the analog signals processed by the analog subassembly).

In one or more embodiments, the analog subassembly 3' comprises one or more radiofrequency analog signal processing components, for example for high-frequency (HF) radiofrequency signals.

In particular, the proposed apparatus can be advantageously applied for an analog subassembly 3' of the type comprising one or more analog components for radiofrequency reception, for example at low level. Because of the sensitivity of this type of analog subassembly at noise levels which are comparable, or even lower than the signal level processed by components of the analog subassembly 3' (which is for example, per satellite receiving signals, on the order of a few dBμV), the operation of the analog subassembly at the expected performance can only be obtained by protecting this analog subassembly from external noise (including external electromagnetic interference) by shielding, comprising for example a shielding cover 5' placed on the side of the electronic board 2'. The use of shielding is even more relevant in the scenario in which the noise level is greater than that of the signals processed by the analog subassembly 3' (noise level which is for example on the order of several tens or hundreds of dBμV, or much greater than that of the satellite receiving signals).

The filtering unit 4 for the apparatus 1 is placed on a signal path between the analog subassembly 3' and power supply/digital block 7'. Additionally, the filtering unit 4' comprises a capacitive component placed under the cover 5' and connected to an analog ground protected by the shielding 5', and a filtering component placed in series and placed on the signaling path passing through the shielding cover 5' or, according to a selected embodiment, immediately next to the shielding cover 5', so as to advantageously increase the filtering effectiveness of the signals coming from the power supply/digital block 7', and also other signals coming from components outside the apparatus 1', routed towards the analog subassembly 3' inside the cover 5'. The one or more embodiments, the filtering unit 4' may thus comprise, on input, a filtering component placed in series on the signal path on passing through the shielding or immediately by the shielding, and on output a capacitive component placed under the shielding.

Advantageously, the filtering component and the capacitive component of the filtering unit 4' are placed on the same side of the electronic board as that on which the shielding cover 5' is placed, such that the filtering unit 4' is placed, at least in part, on the same side of the electronic board as that on which the shielding cover 5' is placed, on a signal path between the analog subassembly 3' protected by the shielding 5' and the power supply/digital block 7' placed outside the shielding.

In one or more embodiments, the electronic apparatus 1 comprises an electronic board 2' on which a printed circuit is implemented for the placement and routing of electronic components on the electronic board 2'. In one or more embodiments, the filtering component placed in series and the capacitive component of the filtering unit 4' are placed on the same side of the electronic board as that on which the components of the analog subassembly 3' and the shielding cover 5' are placed. In one or more embodiments, the filtering unit 4' is placed on the same side of the electronic board as that on which the components of the analog subassembly 3' and the shielding cover 5' are placed. Depending on the embodiment, one or more components of the power supply/digital block 7' may be placed on the same side of the electronic board as that on which components of the analog subassembly 3' and the shielding cover 5' are placed, or the other way around on the opposite side.

The component of the filtering unit 4' receiving the input signal from the filtering unit 4' (which may be, according to the embodiments, an inductive or resistive component) is placed, according to the embodiments, passing through the cover 5' or immediately next to the cover 5' on the outside thereof. In that way, the input signal (to be filtered) of the filtering unit 4' does not enter under the shielding cover 5' so as to not disturb the operation or the performance of the components of the analog subassembly 3'.

The other way around, the capacitive component of the filtering unit 4' is placed under the shielding cover 5' so as to connect with the noise-free electronic environment of the analog subassembly 3 that is protected by the shielding cover 5'.

Thus, the input component of the filtering unit 4', placed in series on passing through the cover 5' or immediately next to the cover 5', makes the connection with the electronic environment of the electronic apparatus 1' (and in particular the power supply/digital block 7') disrupted by noise (because unprotected by the shielding cover 5'), whereas the (capacitive) output component of the filtering unit 4' placed under the shielding cover 5' connects with the noise-free electric environment of the analog subassembly 3' that is protected by the shielding cover 5'.

If the output capacitive component of the filtering unit 4' were placed outside of the shielding cover 5', the whole of the filtering unit 4' would be placed outside of the shielding cover such that the filtered signal (without disruption by noise) on output from the filtering unit 4' could again be subject to noise before entering under the shielding cover 5'. The effectiveness of the filtering unit 4' would therefore find itself potentially greatly reduced. In fact, the capacitive component of the filtering unit 4', if it were placed outside of the shielding cover 5', could itself pick up surrounding electromagnetic noise which would be added to the signal on output from the filtering unit 4' and directed towards the analog subassembly 3'. Further, if the output capacitive component from the filtering unit 4 were placed outside the shielding cover 5', it would be impossible to place the input filtering component of the filtering unit 4' placed in series (on the signal path) on passing through or immediately next to the shielding cover 5'.

In one or more embodiments, the capacitive component of the filtering unit 4' (placed under the shielding cover 5') serves to create a signal path that is very low impedance at high frequency intended for improving the passage of the high-frequency component of the signals to be filtered.

In one or more embodiments, the capacitive component of the filtering unit 4' may be connected to a ground so as to direct the high-frequency signals towards this ground, which serves to filter the high-frequency component from the signals to be filtered.

In one or more embodiments, the printed circuit of the electronic board 2' may be configured with a ground plane comprising an analog ground and a digital ground (sometimes also called mechanical ground) that are distinct from each other. On the figures, a digital ground is represented by a rake symbol, whereas an analog ground is represented by an arrow pointing downward. Digital grounds are grounds intended to receive signals disrupted by noise (for example from digital switching noise), whereas analog grounds are, in contrast to digital grounds, intended to be isolated from these signals disrupted by noise. In the example from FIG. 1b, the analog part, comprising the input interface 6' and the analog subassembly 3', uses an analog ground, whereas the power supply/digital part, comprising the power supply/digital block 7', uses a digital ground.

In one or more embodiments, the ground to which the capacitive component of the filtering unit 4' (placed under the shielding cover 5') is connected is preferably an analog ground, so as to avoid that noise coming from a digital ground (connected to the capacitive component) through the capacitive component comes to disturb the operation or the performance of the analog subassembly. In one or more embodiments, the ground present within the shielding 5' zone in which the capacitive component of the filtering unit 4' is placed is further of the analog type in order to protect the components of this zone from ground noise.

In one or more embodiments, the filtering unit 4' thus implements a filtering structure for the signals on input by a filtering component (for example an inductance and/or a resistance) placed passing through the shielding or immediately next to the shielding (for example placed on the outside, but as close as possible, even adhered to the shielding), and the high-frequency signals having passed through the filtering component (which constitute high-frequency interference isolated by the filtering component on input to the filtering unit 4) and entering under the shielding cover 5' are going to be directed towards the ground by a capacitive component of the filtering unit 4' placed under the shielding cover 5' and connected to an analog ground.

The filtering type or parameters of the filtering unit 4' and in particular the bandwidth may of course be selected as a function of the desired filtering, which may be different according to whether the filtering unit is positioned between a digital subassembly comprising one or more digital components and the analog subassembly, or between a power supply subassembly comprising one or more power supply components and the analog subassembly.

For example, depending on the implementation, the filtering unit 4' may comprise an inductive component L and be configured for implementing an LC type filtering cell or comprise a resistive component R and be configured for implementing an RC type filtering cell.

FIG. 1b shows an example input interface 6' for apparatus 1' configured for receiving a radiofrequency input signal, for example an HF signal, and to be coupled to the analog subassembly 3' for processing the signal received on the input interface 6 by the analog subassembly 3'. For example, in one or more embodiments, the input interface 6' is powered by a low noise power supply block (not shown on the figure) and is arranged for receiving an input modulated video broadcast signal in an input frequency band.

As shown by FIG. 1b, in one or more embodiments, the input interface 6' may be protected by the shielding, and for example be coaxial, in order for example to advantageously be able to connect a coaxial cable for receiving radiofrequency signals, such as for example a cable for receiving video signals broadcast by satellite, to the apparatus 1', by extending shielding to 360° (over the entire surroundings of the cable) in order to protect the input interface 6' with the shielding.

In one or more embodiments, the power supply/digital block 7' comprises a digital subassembly and/or a power supply subassembly, where the digital subassembly comprises one or more digital components, and the power supply subassembly comprises one or more electric power supply components for the analog subassembly 3'. Thus, depending on the selected embodiment, the configuration proposed for the filtering unit 4' may be used for filtering unit used for filtering signals coming from a digital subassembly or for signals coming from a power supply subassembly.

Thus, the configuration proposed for a filtering unit advantageously finds application for filtering signals supplied to the analog subassembly 3', whether these signals come from a power supply subassembly or whether they come from a digital subassembly (the filtering type implemented by the filtering unit 4' may however be chosen according to the scenario).

FIG. 1b therefore shows a filtering unit 4' comprising the filtering component (placed in input to the filtering unit, in series on a signal path electrically connecting, to the analog subassembly 3', one or more components 7' placed on the electronic board 2' outside the shielding 5') and the capacitive component placed under the shielding, one component of which is, in whole or in part, placed outside of the shielding (filtering component), and at least one other component is placed inside the shielding (capacitive component). According to the embodiment, the component of the filtering unit 4' is positioned passing through the cover 5' protecting the analog subassembly 3' from electromagnetic interference, or positioned immediately by the exterior of the shielding 5'. In one or more embodiments, the filtering component placed in series is placed passing through the shielding (for example passing through the shielding cover of the shielding protecting the analog subassembly 3'), in which case the filtering component is in part outside the shielding and in part inside the shielding, such that the signal output from this component is then protected by the shielding. In other embodiments, this filtering component placed in series is placed outside of the shielding and immediately next to the shielding (for example passing through the shielding cover of the shielding protecting the analog subassembly 3'), in which case the filtering component is placed outside of the shielding but immediately next to this shielding such that the length of the signal path between the output of this component and the shielding 5' is as short as possible (given the constraints on placement of electronic elements on the board 2'), in order to minimize as much as possible the path length on output from the filtering component placed in series which is not protected by the shielding.

In one or more embodiments, this filtering component placed in series is placed passing through the shielding (for example passing through the shielding cover of the shielding protecting the analog subassembly 3'), in which case the filtering component is in part outside the shielding and in part inside the shielding, such that the signal output from this component is then protected by the shielding. In other embodiments, this filtering component placed in series is placed outside of the shielding and immediately next to the shielding (for example passing through the shielding cover of the shielding protecting the analog subassembly 3'), in which case the filtering component is placed outside of the shielding but immediately next to this shielding such that the length of the signal path between the output of this component and the shielding 5' is as short as possible (given the constraints on placement of electronic elements on the board 2'), in order to minimize as much as possible the path length on output from the filtering component placed in series which is not protected by the shielding.

Figure 2A:
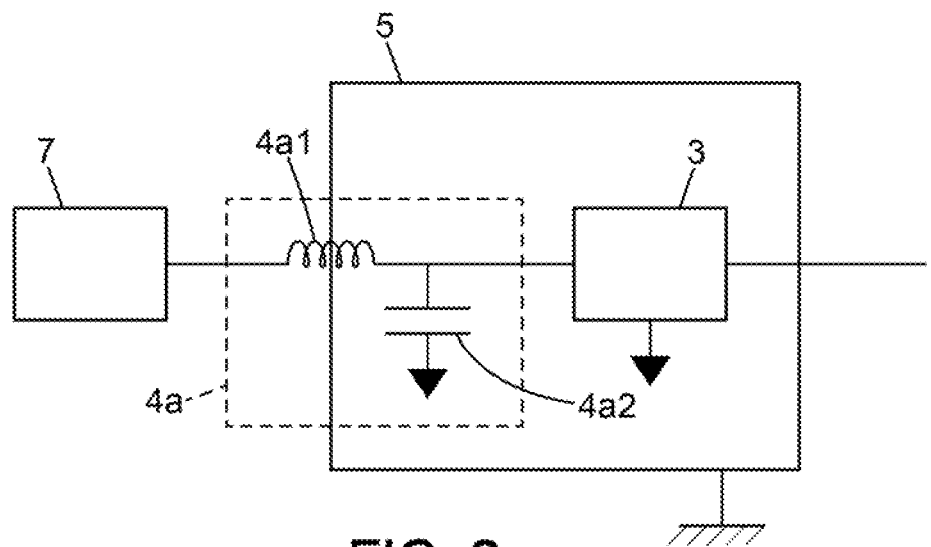
FIG. 2a is a drawing showing a filtering unit example according to one or more embodiments.

FIG. 2a shows a filtering unit example according to one or more embodiments.

FIG. 2a shows an embodiment example of a filtering unit 4a comprising an LC type filtering cell placed on a signal path between an analog subassembly 3 and the power supply/digital block 7, like those shown in FIGS. 1a and 1b, passing through the shielding cover 5 protecting the analog subassembly 3.

The filtering unit 4a is thus positioned for filtering a signal coming from the power supply/digital block 7 routed to the analog subassembly 3, such as, for example, according to the embodiment, a control signal (for example an $I_2C$ type bus format) coming from a digital subassembly of the power supply/digital block 7, or a power supply signal from a power supply subassembly.

The filtering unit 4a comprises an LC filtering cell comprising a capacitive component 4a2 and an inductive component 4a1. In one or more embodiments, the capacitive component 4a2 is placed on the side of the analog subassembly 3, in the example shown inside the cover 5, and the inductive component 4a1 is placed on the power supply/digital block 7 side, in the example shown passing through the cover 5. The inductive component 4a1 is placed in input to the LC cell, and operates as filtering component which receives on input the signals coming from the power supply/digital block 7 in order to filter them.

The capacitive component 4a2 is connected to an analog ground, so as to filter, on the inside of the shielding cover 5, the noise present in the signals coming from the inductive component 4a1 in the frequency band to be filtered, by passing this noise to the analog ground. The capacitive component 4a2 is preferably selected so as to have a low impedance in the target frequency band of the filter. In this frequency band, it behaves like a wire and the noise to be filtered is directed to the analog ground.

Referring to FIG. 2a, in embodiments where an LC type filtering cell 4a is used, in order to improve the effectiveness of the input filtering—of both an analog subassembly 3 comprising one or more analog components and protected from electromagnetic interference by a cover 5, and also a power supply/digital block 7 (comprising a subassembly of digital components and/or an electric power supply subassembly)—the LC filtering may be configured by placing the inductive component 4a1 astride under the shielding cover 5 between the power supply/digital block 7 and the analog part 3. The low impedance part of the LC filter is thus placed in the analog part under the protective shielding 5.

Figure 2B:
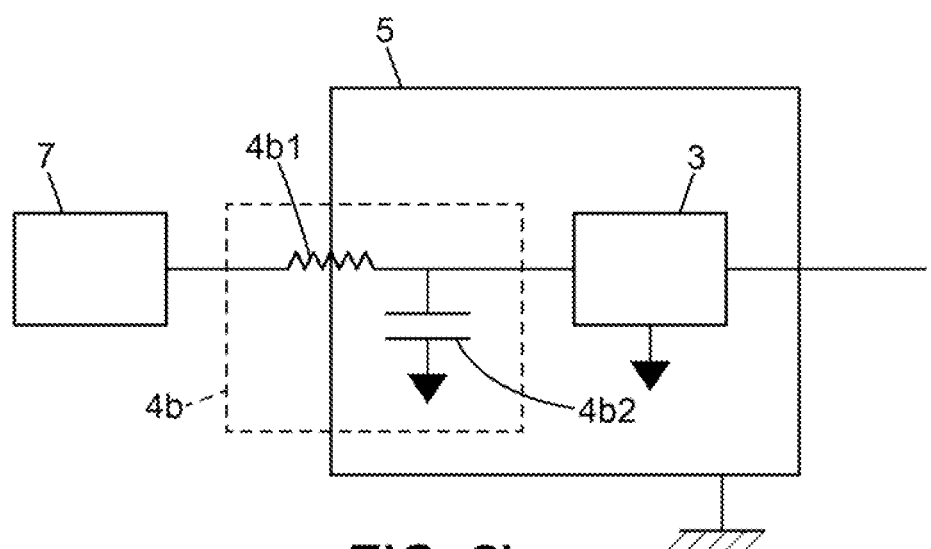
FIG. 2b is a drawing showing a filtering unit example according to one or more embodiments.

FIG. 2b shows a filtering unit example according to one or more embodiments.

FIG. 2b shows an embodiment example of a filtering unit 4b comprising an RC type filtering cell placed on a signal path between an analog subassembly 3 and the power supply/digital block 7, like those shown in FIGS. 1a and 1b, passing through the shielding cover 5 protecting the analog subassembly 3.

The filtering unit 4b is thus positioned for filtering a signal coming from the power supply/digital block 7 routed to the analog subassembly 3, such as, for example, according to the embodiment, a control signal (for example an $I_2C$ type bus format) coming from a digital subassembly of the power supply/digital block 7, or a power supply signal from a power supply subassembly.

The filtering unit 4b comprises an RC filtering cell comprising a capacitive component 4b2 and a resistive component 4b1. In one or more embodiments, the capacitive component 4b2 is placed on the side of the analog subassembly 3, in the example shown inside the cover 5, and the resistive component 4b1 is placed on the side of the power supply/digital block 7, in the example shown passing through the cover 5. The resistive component 4b1 is placed in input to the RC cell, and operates as filtering component which receives on input the signals coming from the power supply/digital block 7 in order to filter them.

The capacitive component 4b2 is connected to an analog ground, so as to filter, on the inside of the shielding cover 5, the noise present in the signals coming from the resistive component 4b1 in the frequency band to be filtered, by passing this noise to the analog ground. The capacitive component 4b2 is preferably selected so as to have a low impedance in the target frequency band of the filter. In this frequency band, it behaves like a wire and the noise to be filtered is directed to the analog ground.

Referring to FIG. 2b, in embodiments where an RC type filtering cell 4b is used, in order to improve the effectiveness of the input filtering—of both an analog subassembly 3 comprising one or more analog components and protected from electromagnetic interference by a cover 5, and also a power supply/digital block 7 (comprising a subassembly of digital components and/or an electric power supply subassembly)—the RC filtering may be configured by placing the resistive component 4b1 astride under the shielding cover 5 between the power supply/digital block 7 and the analog part 3. The low impedance part of the RC filter is thus placed in the analog part 3 under the protective shielding 5.

Figure 2C:
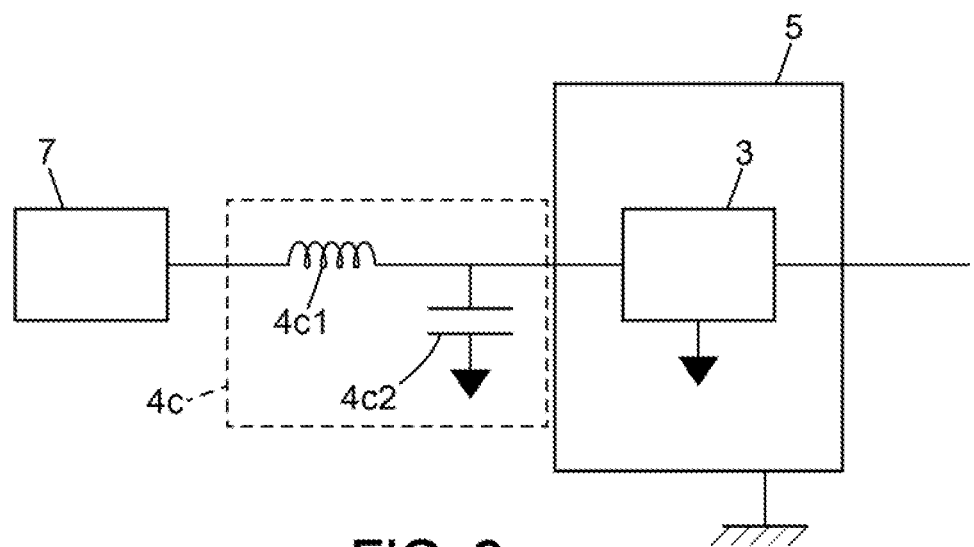
FIG. 2c is a drawing showing a filtering unit example according to one or more embodiments.

FIG. 2c shows a filtering unit example according to one or more embodiments.

FIG. 2c shows an embodiment example of a filtering unit 4c comprising an LC type filtering cell placed on a signal path between an analog subassembly 3 and the power supply/digital block 7, like those shown in FIGS. 1a and 1b, without passing through the shielding cover 5 protecting the analog subassembly 3.

The filtering unit 4c is thus positioned for filtering a signal coming from the power supply/digital block 7 routed to the analog subassembly 3, such as, for example, according to the embodiment, a control signal (for example an $I_2C$ type bus format) coming from a digital subassembly of the power supply/digital block 7, or a power supply signal from a power supply subassembly.

The filtering unit 4c comprises an LC filtering cell comprising a capacitive component 4c2 and an inductive component 4c1. In one or more embodiments, the capacitive component 4c2 is placed on the side of the analog subassembly 3, in the example shown inside the cover 5, and the inductive component 4c1 is placed on the power supply/digital block 7 side, in the example shown outside the cover 5 and immediately next to the cover 5. The inductive component 4c1 is placed in input to the LC cell, and operates as filtering component which receives on input the signals coming from the power supply/digital block 7 in order to filter them.

The inductive component 4c1 is placed as close as possible to the cover 5 so as to minimize as much as possible the signal path between the output of the inductive component 4c1 and the cover 5, in order to avoid picking up any environmental noise which could reduce the effectiveness of the filtering done by the filtering unit 4c. In one or more embodiments, the inductive component 4c1 may be placed closest to the cover 5 on the outside thereof, such that the length of the signal path portion between the output of the inductive component 4c1 and the cover 5 is minimal, or even nearly zero, in order that the interference caused by the noise picked up by this portion are negligible.

The capacitive component 4c2 is connected to an analog ground, so as to filter, on the inside of the shielding cover 5, the noise present in the signals coming from the inductive component 4c1 in the frequency band to be filtered, by passing this noise to the analog ground. The capacitive component 4c2 is preferably selected so as to have a low impedance in the target frequency band of the filter. In this frequency band, it behaves like a wire and the noise to be filtered is directed to the analog ground.

Referring to FIG. 2c, in embodiments where an LC type filtering cell 4c is used, in order to improve the effectiveness of the input filtering—of both an analog subassembly 3 comprising one or more analog components and protected from electromagnetic interference by a cover 5, and also a power supply/digital block 7 (comprising a subassembly of digital components and/or an electric power supply subassembly)—the LC filtering may be configured by placing the inductive component 4c1 closest to the shielding cover 5 between the power supply/digital block 7 and the analog part 3 whereas the capacitive component 4c2 remains placed under the shielding cover 5. The low impedance part of the LC filter is thus placed in the analog part 3 under the protective shielding 5.

Figure 2D:
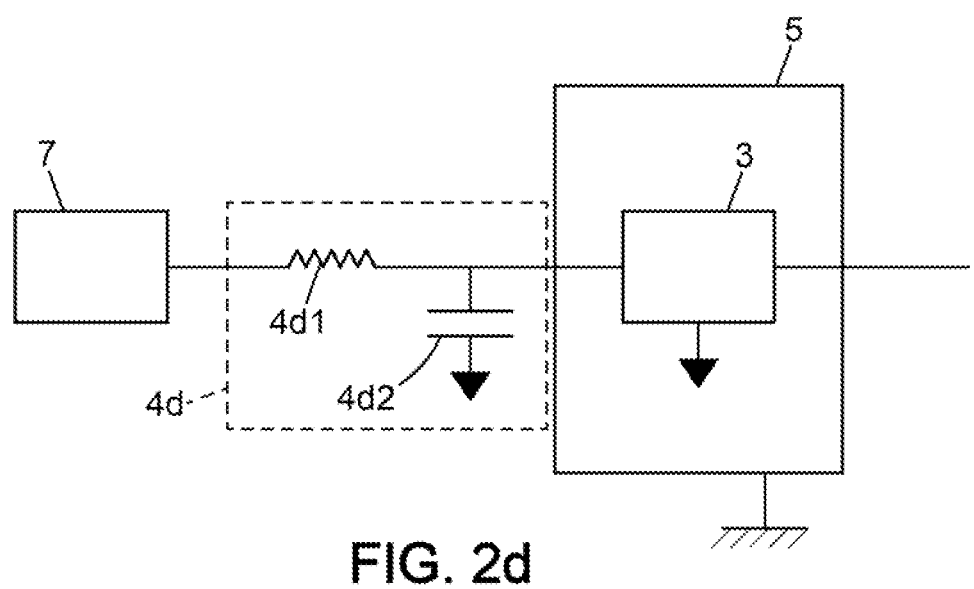
FIG. 2d is a drawing showing a filtering unit example according to one or more embodiments.

FIG. 2d shows a filtering unit example according to one or more embodiments.

FIG. 2d shows an embodiment example of a filtering unit 4d comprising an RC type filtering cell placed on a signal path between an analog subassembly 3 and the power supply/digital block 7, like those shown in FIGS. 1a and 1b, passing through the shielding cover 5 protecting the analog subassembly 3.

The filtering unit 4d is thus positioned for filtering a signal coming from the power supply/digital block 7 routed to the analog subassembly 3, such as, for example, according to the embodiment, a control signal (for example an I$_2$C type bus format) coming from a digital subassembly of the power supply/digital block 7, or a power supply signal from a power supply subassembly.

The filtering unit 4d comprises an RC filtering cell comprising a capacitive component 4d2 and a resistive component 4d1. In one or more embodiments, the capacitive component 4d2 is placed on the side of the analog subassembly 3, in the example shown inside the cover 5, and the resistive component 4d1 is placed on the power supply/digital block 7 side, in the example shown outside the cover 5 and immediately next to the cover 5. The resistive component 4d1 is placed in input to the RC cell, and operates as filtering component which receives on input the signals coming from the power supply/digital block 7 in order to filter them.

The resistive component 4d1 is placed as close as possible to the cover 5 so as to minimize as much as possible the signal path between the output of the resistive component 4d1 and the cover 5, in order to avoid picking up any environmental noise which could reduce the effectiveness of the filtering done by the filtering unit 4d. In one or more embodiments, the resistive component 4d1 may be placed closest to the cover 5 on the outside thereof, such that the length of the signal path portion between the output of the resistive component 4d1 and the cover 5 is minimal, or even nearly zero, in order that the interference caused by the noise picked up by this portion are negligible. The capacitive component 4d2 is connected to an analog ground, so as to filter, on the inside of the shielding cover 5, the noise present in the signals coming from the resistive component 4d1 in the frequency band to be filtered, by passing this noise to the analog ground. The capacitive component 4d2 is preferably selected so as to have a low impedance in the target frequency band of the filter. In this frequency band, it behaves like a wire and the noise to be filtered is directed to the analog ground.

Referring to FIG. 2d, in embodiments where an RC type filtering cell 4d is used, in order to improve the effectiveness of the input filtering—of both an analog subassembly 3 comprising one or more analog components and protected from electromagnetic interference by a cover 5, and also a power supply/digital block 7 (comprising a subassembly of digital components and/or an electric power supply subassembly)—the RC filtering may be configured by placing the resistive component 4d1 closest to the shielding cover 5 between the power supply/digital block 7 and the analog part 3 whereas the capacitive component 4d2 remains placed under the shielding cover 5. The low impedance part of the RC filter is thus placed in the analog part 3 under the protective shielding 5.

Figure 3:
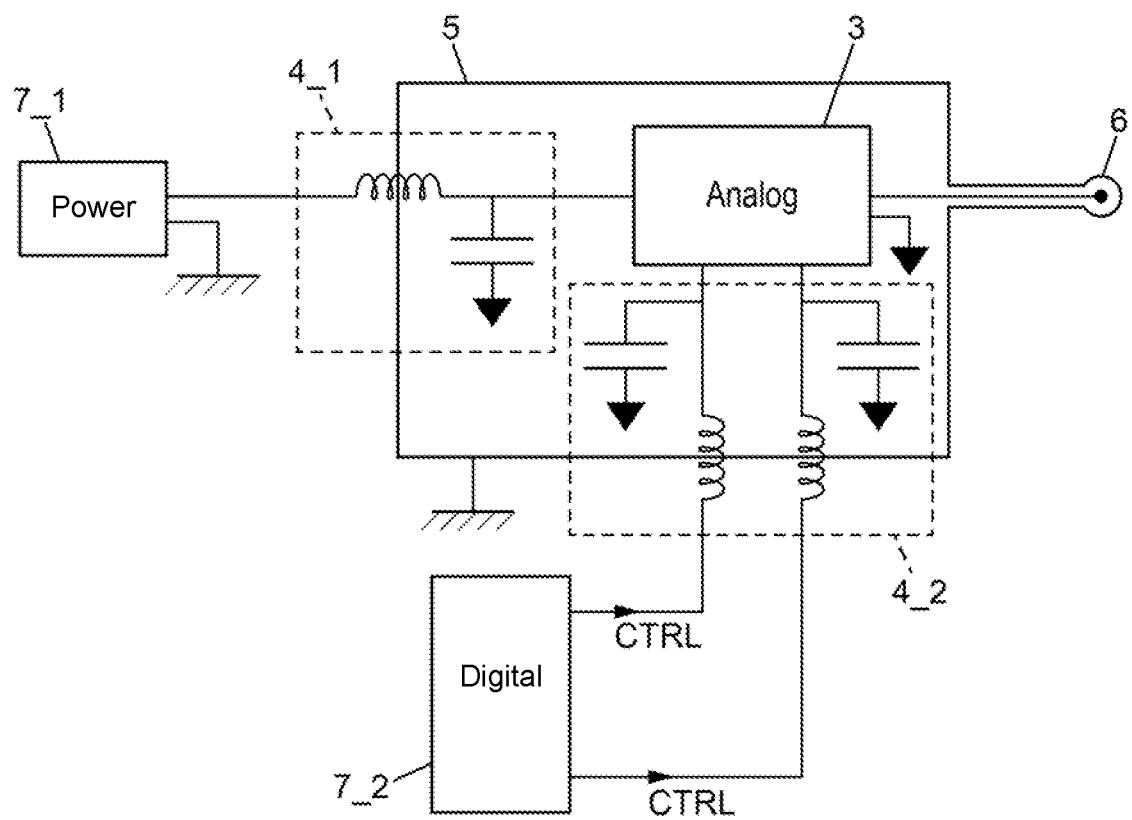
FIG. 3 is a drawing showing an electronic apparatus example according to one or more embodiments.

FIG. 3 shows an electronic apparatus example according to one or more embodiments.

The apparatus 10 from FIG. 3 comprises an electronic board 20 on which are located in analog subassembly 3, a power supply subassembly 7_1, a digital subassembly 7_2, two filtering units 4_1 and 4_2, and an input interface 6. The analog subassembly 3 is protected from external electromagnetic interference by shielding, taking for example the form of a cover 5.

In one or more embodiments, the analog subassembly 3 comprises one or more radiofrequency analog components, for example high-frequency (HF), which may be powered by a high-frequency signal.

In particular, the proposed apparatus can advantageously be applied for an analog subassembly 3 of the type comprising one or more analog components for radiofrequency reception, for example at low level. Because of the sensitivity of this type of analog subassembly to noise levels which are large relative to the signal level processed by components of the analog subassembly, the operation of the analog subassembly at the expected performance can only be obtained by protecting this analog subassembly from external noise (including external electromagnetic interference) by shielding, taking for example the form of a cover 5.

In one or more embodiments, the digital subassembly 7_2 comprises one or more digital components and is configured for generating one or more control signals (CTRL) for controlling the analog subassembly 3. The power supply subassembly 7_1 comprises one or more electric power supply components for the analog subassembly 3 and is configured for generating a power supply signal for the analog subassembly 3.

The filtering unit 4_1 is positioned so as to increase the filtering effectiveness of power supply signals coming from the power supply subassembly 7_1 routed to the analog subassembly 3 inside the cover 5.

The filtering unit 4_2 is positioned so as to increase the filtering effectiveness of differential control signals CTRL coming from the digital block 7_2 routed to the analog subassembly 3 inside the cover 5.

The filtering type or parameters for each of the filtering units 4_1 and 4_2, and in particular the bandwidth may be selected as a function of the desired filtering, which may be different according to whether the filtering unit is positioned between a digital subassembly 7_2 comprising one or more digital components and the analog subassembly 3, or between a power supply subassembly 7_1 comprising one or more power supply components and the analog subassembly 3.

FIG. 3 shows filtering units 4_1 and 4_2 which each comprise at least one LC type filtering cell. In order to filter each of the signal paths of the differential signals coming from the digital subassembly 7_2, the filtering unit 4_2 comprises two LC type filtering cells, each positioned on a signal path of a control signal coming from the digital subassembly 7_2 according to a proposed configuration embodiment.

Nevertheless, the person skilled in the art could observe that all other filtering types or parameters suitable for power supply signal filtering and/or, according to the scenario, digital signal filtering (for example control signals are shown in FIG. 3), may be used in place or in addition to LC filtering cells 4_1 and 4_2, which are described only as examples. For example, depending on the implementation, each of the filtering units 4_1 and 4_2 may comprise an inductive component L and be configured for implementing an LC type filtering cell or comprise a resistive component R and be configured for implementing an RC type filtering cell.

FIG. 3 shows embodiments in which each of the filtering units 4_1 is positioned passing through the cover 5 protecting the analog subassembly 3 from electromagnetic interference, in that each of the respective inductive components of the LC cells of the filtering units 4_1 and 4_2 is positioned on the electronic board 20 astride (or passing through) under the protective cover 5. The respective capacitive components of the LC cells of the filter units 4_1 and 4_2 are positioned on the electronic board 20 under the protective cover 5.

The input interface 6 for the apparatus may be configured for receiving a radiofrequency input signal, for example an HF signal, and to be coupled to the analog subassembly 3 for processing the signal received on the input interface 6 by the analog subassembly 3. For example, in one or more embodiments, the input interface is powered by a low noise power supply block (not shown on the figure) and is arranged for receiving an input modulated video broadcast signal in an input frequency band.

In one or more embodiments, the input interface 6 may be protected by the shielding, and for example be coaxial, in order for example to advantageously be able to connect a coaxial cable for receiving radiofrequency signals, such as for example a cable for receiving video signals broadcast by satellite, to the apparatus 10, by extending shielding to 360° (over the entire surrounding of the cable) in order to protect the input interface 6 with the shielding.

Thus, the configuration proposed for a filtering unit advantageously finds application for filtering signals supplied to the analog subassembly 3, whether these signals come from a power supply subassembly 7_1 or whether they come from a digital subassembly 7_2 (the filtering type implemented by the filtering unit 4 may however be chosen according to the scenario).

The configuration of the apparatus 10 shown in FIG. 3 may advantageously be implemented on a broadcast video signal acquisition board.

The person skilled in the art could nevertheless notice that the proposed apparatus is not limited to a specific application, and that the technical solutions and advantages described above in connection with the nonlimiting apparatus examples from FIGS. 1a, 1b and 3 can be used for all types of digital cards on which an analog subassembly, a digital subassembly and/or a power supply subassembly, and a signal filtering unit are placed between the analog subassembly and one among the digital subassembly of the power supply subassembly.

Depending on the selected embodiment, some acts, actions, events or functions of each of the methods described in the present document may be done or produced according to a different order from that in which they were described, or may be added, merged or else not done or not produced, according to the case. Additionally, in some embodiments, some acts, actions or events are done or produced concurrently and not successively.

Although described through some number of detailed implementation examples, the proposed process and the apparatus for executing an embodiment of the process comprise different variants, modifications and improvements which will be apparent to the person skilled in the art, with it understood that these different variants, modifications and improvements are part of the scope of the present subject disclosure, such as defined by the following claims. Further, various aspects and characteristics described above may be implemented together or separately, or else substituted for each other, and the whole of the various combinations and sub-combinations of aspects and characteristics are part of the scope of the present subject disclosure. Further, it is possible that some systems and equipment described above do not incorporate all of the modules and functions described for the preferred embodiments.

The invention claimed is:

1. An electronic apparatus comprising:
   an electronic board on which are placed an analog subassembly and a filtering unit, the analog subassembly comprising one or more analog components;
   wherein the analog subassembly is protected by shielding placed on one side of the electronic board,
   wherein the filtering unit is placed on the side of the electronic board on a signal path electrically connected to the analog subassembly,
   wherein the filtering unit comprises a capacitive component placed under the shielding and connected to an analog ground,
   and wherein the filtering unit further comprises a filtering component placed on an input to the filtering unit in series with the signal path on passing through the shielding or in an immediate vicinity of the shielding,
   wherein the electronic apparatus further comprises a power supply/digital block placed on the electronic board, where the power supply/digital block comprises a digital subassembly and/or a power supply subassembly, wherein the digital subassembly comprises one or more digital components, and the power supply subassembly comprises one or more electric power supply components for the analog subassembly, wherein the filtering unit is placed between the analog subassembly and the power supply/digital block.

2. The electronic apparatus according to claim 1, wherein the one or more analog components receive radio frequency signals.

3. The electronic apparatus according to claim 1, wherein the signal path is between the analog subassembly and the digital subassembly.

4. The electronic apparatus according to claim 3, wherein the filtering unit is configured for filtering a control signal coming from the digital subassembly in order to control the analog subassembly.

5. The electronic apparatus according to claim 1, wherein the signal path is between the analog subassembly and the power supply subassembly.

6. The electronic apparatus according to claim 5, wherein the filtering unit is configured for filtering a power supply signal coming from the power supply subassembly in order to electrically supply the analog subassembly.

7. The electronic apparatus according to claim 1, wherein the filtering unit comprises an LC or RC type filtering cell.

8. The electronic apparatus according to claim 1, wherein the shielding comprises a shielding cover, and wherein the filtering component placed in series on the signal path is placed passing through the shielding cover or immediately by the shielding cover.

9. The electronic apparatus according to claim 1, wherein the shielding comprises a shielding cover, and wherein the filtering component placed in series is an inductive component placed astride in series under the shielding cover between the power supply/digital block and the analog subassembly.

10. The electronic apparatus according to claim 1, wherein the shielding comprises a shielding cover, and wherein the filtering component placed in series is a resistive component placed astride in series under the shielding cover between the power supply/digital block and the analog subassembly.

11. The electronic apparatus according to claim 1, wherein the shielding comprises a shielding cover, and wherein the filtering component placed in series on the signal path is placed passing through the shielding cover or immediately by the shielding cover.

12. The electronic apparatus according to claim 11, wherein the signal path is between the analog subassembly and the digital subassembly, and wherein the filtering component placed in series on the signal path is placed passing through the shielding cover or immediately by the shielding cover.

13. The electronic apparatus according to claim 12, wherein the filtering unit is configured for filtering a control signal coming from the digital subassembly in order to control the analog subassembly.

14. The electronic apparatus according to claim 1, wherein the shielding comprises a shielding cover, and wherein the filtering component placed in series is an inductive component placed astride in series under the shielding cover between the power supply/digital block and the analog subassembly.

15. The electronic apparatus according to claim 14, wherein the signal path is between the analog subassembly and the digital subassembly, and wherein the filtering component placed in series is an inductive component placed astride in series under the shielding cover between the power supply/digital block and the analog subassembly.

16. The electronic apparatus according to claim 15, wherein the filtering unit is configured for filtering a control signal coming from the digital subassembly in order to control the analog subassembly.

17. The electronic apparatus according to claim 1, wherein the shielding comprises a shielding cover, and wherein the filtering component placed in series is a resistive component placed astride in series under the shielding cover between the power supply/digital block and the analog subassembly.

18. The electronic apparatus according to claim 17, wherein the signal path is between the analog subassembly and the digital subassembly.

19. The electronic apparatus according to claim 18, wherein the filtering unit is configured for filtering a control signal coming from the digital subassembly in order to control the analog subassembly, and wherein the filtering component placed in series is the resistive component placed astride in series under the shielding cover between the power supply/digital block and the analog subassembly.

* * * * *